(12) United States Patent
Kang et al.

(10) Patent No.: US 10,917,103 B2
(45) Date of Patent: Feb. 9, 2021

(54) ANALOG-TO-DIGITAL CONVERTER DEVICE AND METHOD FOR CALIBRATING CLOCK SKEW

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Wen-Juh Kang, Hsinchu (TW); Yu-Chu Chen, Hsinchu (TW); Man-Pio Lam, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/748,757

(22) Filed: Jan. 21, 2020

(65) Prior Publication Data
US 2020/0235747 A1 Jul. 23, 2020

(30) Foreign Application Priority Data

Jan. 23, 2019 (TW) .............................. 108102604 A
Aug. 30, 2019 (TW) .............................. 108131420 A

(51) Int. Cl.
*H03M 1/00* (2006.01)
*H03M 1/10* (2006.01)

(52) U.S. Cl.
CPC ................................ *H03M 1/1023* (2013.01)

(58) Field of Classification Search
CPC .......................... H03M 1/2023; H03M 1/1023
USPC ................................ 341/120, 118, 155, 159
See application file for complete search history.

(56) References Cited

U.S. PATENT DOCUMENTS

| | | | |
|---|---|---|---|
| 7,839,323 B2 | 11/2010 | Kidambi | |
| 9,270,291 B1* | 2/2016 | Parnaby | H03M 1/1028 |
| 10,218,372 B1* | 2/2019 | Farley | H03M 1/0634 |

\* cited by examiner

*Primary Examiner* — Peguy Jean Pierre
(74) *Attorney, Agent, or Firm* — CKC & Partners Co., LLC

(57) ABSTRACT

An analog-to-digital converter (ADC) device includes ADC circuitries, a calibration circuitry, and a skew adjusting circuitry. The ADC circuitries convert an input signal according to interleaved clock signals, in order to generate first quantized outputs. The calibration circuitry performs at least one calibration operation according to the first quantized outputs to generate second quantized outputs. The skew adjusting circuitry analyzes time difference information within even-numbered sampling periods of the clock signals, in order to generate adjustment signals. The adjustment signals are for reducing a clock skew in the ADC circuitries.

11 Claims, 8 Drawing Sheets

ANALOG-TO-DIGITAL CONVERTER DEVICE AND METHOD FOR CALIBRATING CLOCK SKEW

PRIORITY CLAIM AND CROSS-REFERENCE

The present application claims priority to Taiwan Application Serial Number 108131420, filed Aug. 30, 2019, and Taiwan Application Serial Number 108102604, filed Jan. 23, 2019, which are herein incorporated by reference in their entireties.

BACKGROUND

Field of Invention

This application relates to an analog-to-digital converter device, and particularly relates to a time-interleaved analog-to-digital converter and a clock skew calibration method thereof.

Description of Related Art

In practical applications, analog-to-digital converters can have their own resolution or linearity affected due to timing errors (e.g. timing offset). In existing techniques, when the frequency of the input signal is close to the sampling frequency, it is difficult to effectively correct the timing error due to an insufficient time information acquired, resulting in a decrease in the performance of the analog-to-digital converter.

SUMMARY

In order to address the above problems, some aspects of the present application provide an analog-to-digital converter device which includes a plurality of analog-to-digital converter circuitries, a calibration circuitry and a skew adjusting circuitry. The plurality of analog-to-digital converter circuitries are configured to convert an input signal according to an interleaved plurality of clock signals to generate a plurality of first quantized outputs. The calibration circuitry is configured to perform at least one calibration operation according to the first quantized outputs to generate a plurality of second quantized outputs. The skew adjusting circuitry is configured to analyze time difference information within even-numbered sampling periods of the clock signals according to the second quantized outputs to generate a plurality of adjustment signals. The adjustment signals are for reducing a clock skew in the analog-to-digital converter circuitries.

Some aspects of the present application provide a clock skew calibration method, which includes the following operations: performing at least one calibration operation according to a plurality of first quantized outputs that are output from a plurality of analog-to-digital converter circuitries based on a plurality of clock signals, so as to generate a plurality of second quantized outputs; and analyzing a time difference information in an even-numbered sampling periods of the clock signals according to the second quantized outputs, so as to generate a plurality of adjustment signals to reduce a clock skew in the analog-to-digital converter circuitries.

In summary, the analog digital converter device and the clock skew calibration method provided by some embodiments of the present application can perform calibration by analyzing time difference information of multiple clock signals within even-numbered sampling periods. Thus, when the frequency of the input signal is close to the sampling frequency, the clock skew can still be effectively calibrated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

All terms used herein have their standard meanings. The definition of the above terms in commonly used dictionaries, including any used examples of the terms discussed herein, that are in the content of the present application are illustrative examples only, and should not limit the scope and meaning of the present application. Similarly, the present application is not limited to the various embodiments shown in this specification.

The terms "coupled" or "connected" as used herein can both indicate that two or more components are in direct physical or electrical contact with each other, or in indirect physical or electrical contact with each other, and can also indicate that two or more components operate or act with each other.

The term "circuitry" as used herein generally refers to a single system formed from comprising one or more circuits. The term "circuit" generally refers to an object that processes signals by connecting one or more transistors and/or one or more active and passive components in a certain manner.

The terms "about," "substantially" or "equivalent" as used herein generally refers to a value error or range within about twenty percent, preferably within about ten percent, and more preferably within about five percent. Unless otherwise stated herein, the values mentioned herein are regarded as approximations, that is, errors or ranges expressed by terms such as "about," "substantially" or "equivalent."

Figure 1A:
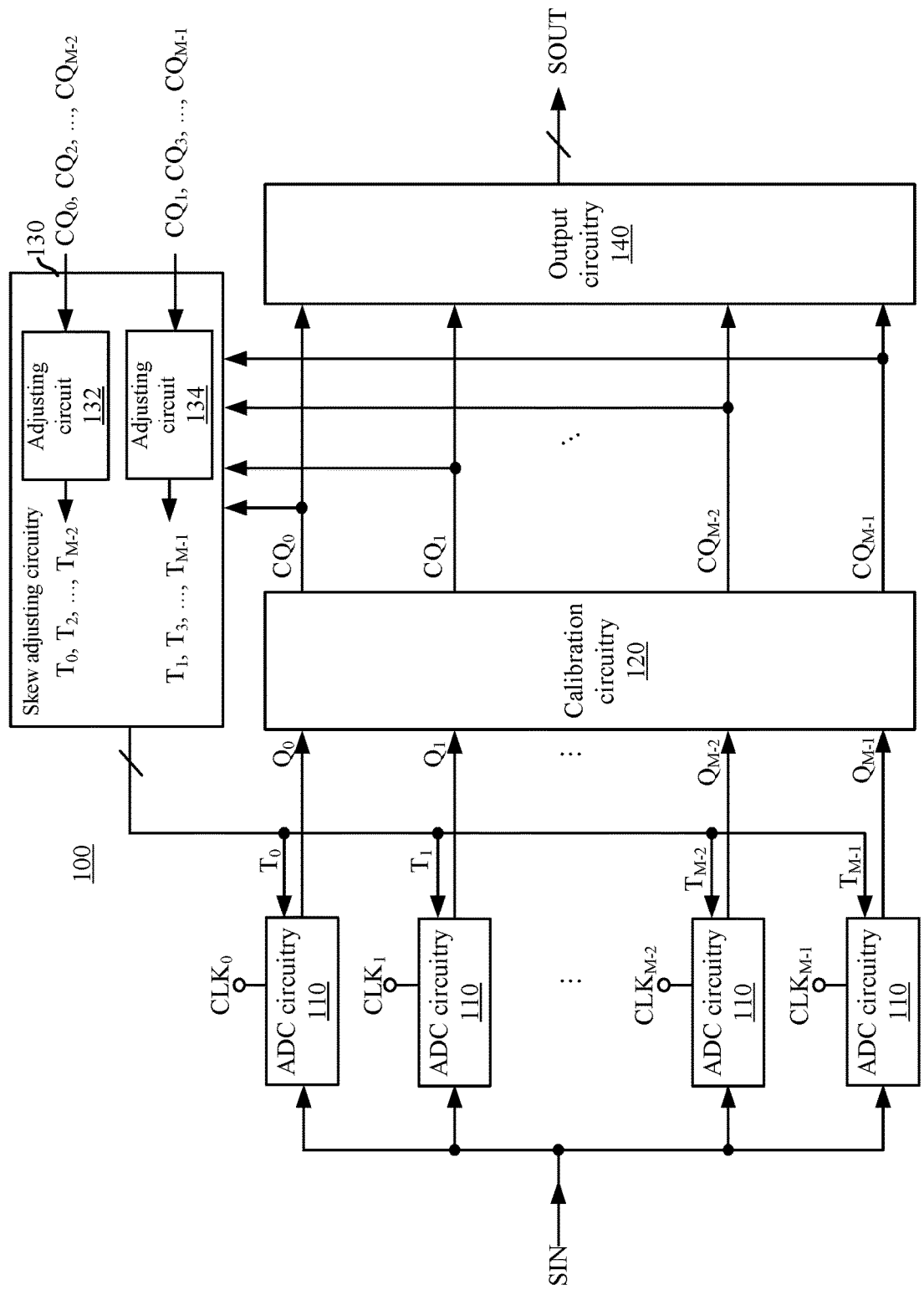
FIG. 1A is a schematic of the digital analog converter device illustrated in accordance with some embodiments of the present application.
Figure 1B:
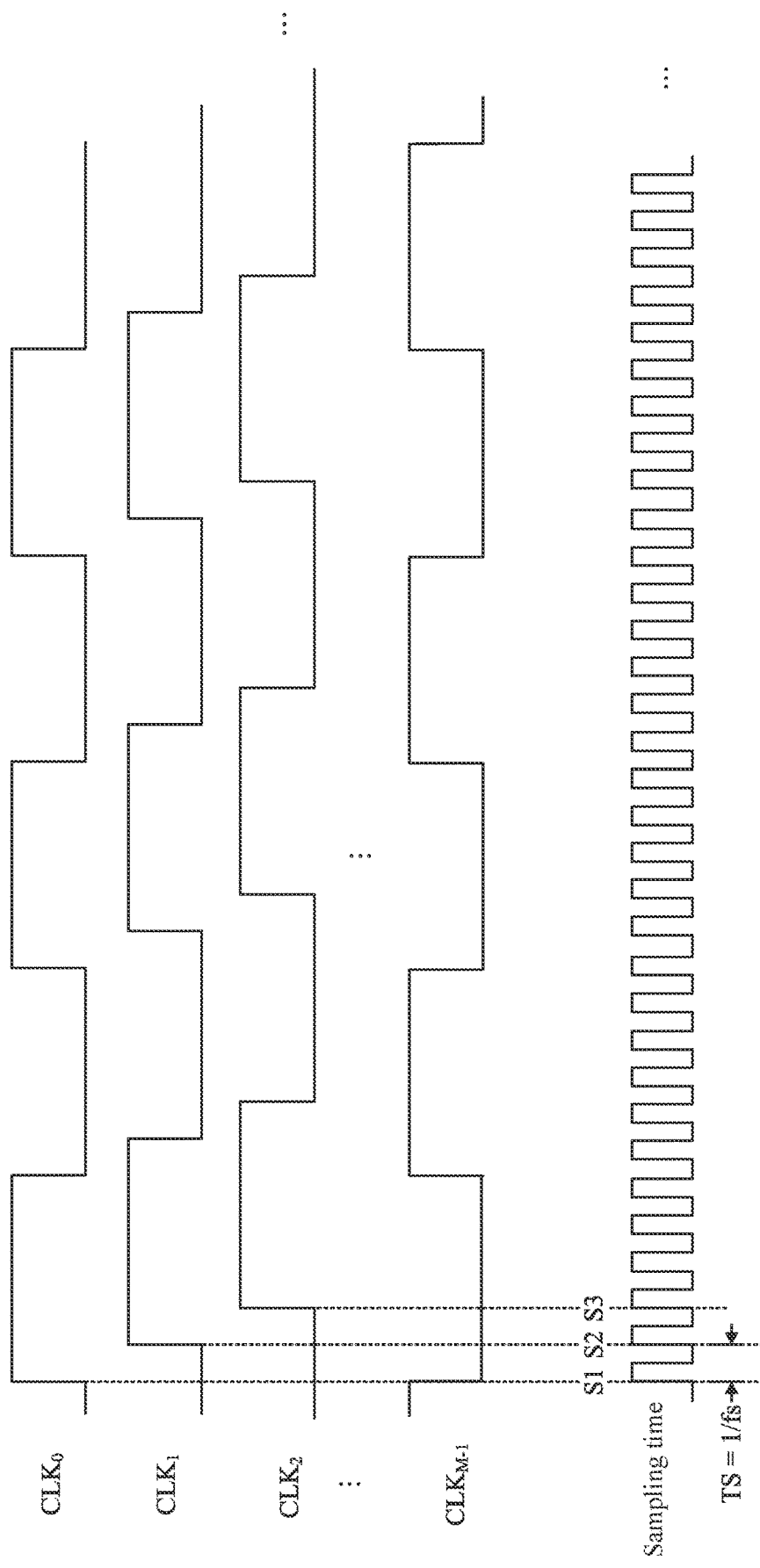
FIG. 1B is a waveform schematic of multiple clock signals in FIG. 1A illustrated in accordance with some embodiments of the present application.

Referring to FIG. 1A and FIG. 1B, FIG. 1A is a schematic of the analog-to-digital converter (ADC) device 100 illustrated in accordance with some embodiments of the present application. FIG. 1B is a waveform schematic of multiple clock signals $CLK_0$-$CLK_{M-1}$ in FIG. 1A illustrated in accordance with some embodiments of the present application. In some embodiments, the ADC device 100 operates as a time-interleaved ADC with multi-channels.

In some embodiments, the ADC device 100 comprises multiple ADC circuitries 110, a calibration circuitry 120, a skew adjusting circuitry 130 and an output circuitry 140. Each ADC circuitry 110 operates as a single channel. In other words, in this example, the ADC device 100 includes M channels. In some embodiments, M is an even number.

As shown in FIG. 1A, multiple ADC circuitries 110 are configured to conduct analog-to-digital conversion to the input signal SIN according to a corresponding one of the plurality of clock signals $CLK_0$-$CLK_{M-1}$, so as to generate a corresponding one of the multiple quantized outputs $Q_0$-$Q_{M-1}$.

In some embodiments, as shown in FIG. 1B, there exists a timing interval between two adjacent clock signals among the multiple clock signals $CLK_0$-$CLK_{M-1}$. As such, the first channel and the second channel will perform sampling operations and analog-to-digital conversions at different times. For example, the first channel (i.e., the ADC circuitries 110 that operates according to clock signal $CLK_0$) samples the input signal SIN at a first sampling time S1 and conducts analog-to-digital conversion, and the second channel (i.e., the ADC circuitries 110 that operates according to clock signal $CLK_1$) samples the input signal SIN at a second sampling time S2 and conducts analog-to-digital conversion. Wherein, the difference between the sampling times S1 and S2 is the sampling period TS (its corresponding sampling frequency being fs, i.e., TS=1/fs). By following the same principle, M channels can operate according to multiple interleaving timings.

Calibration circuitry 120 is coupled to each of the ADC circuitries 110 to receive multiple quantized outputs $Q_0$-$Q_{M-1}$. Calibration circuitry 120 can perform at least one calibration operation according to the quantized outputs $Q_0$-$Q_{M-1}$, so as to calibrate offset and gain errors in the multiple ADC circuitries 110, and generate multiple calibrated quantized outputs $CQ_0$-$CQ_{M-1}$.

In some embodiments, the calibration circuitry 120 can be a foreground calibration circuit or a background calibration circuit. For example, the calibration circuitry 120 can include a pseudo-random value generator circuit (not shown) and a digital processing circuit (not shown), wherein the pseudo-random value generator circuit generates a calibration signal to the ADC circuitries 110, and the digital processing circuit can perform an adaptive algorithm (i.e., the aforementioned at least one calibration operation) according to the multiple quantized outputs $Q_0$-$Q_{M-1}$ to reduce the offset or error of the quantized outputs $Q_0$-$Q_{M-1}$.

The above-mentioned calibration circuitry 120 is for illustrative purposes only, and the present application is not limited thereto. Various types of calibration operation and calibration circuitry 120 are covered by the scope of this application.

The skew adjusting circuitry 130 is coupled to the calibration circuitry 120 to receive multiple calibrated quantized outputs $CQ_0$-$CQ_{M-1}$. In some embodiments, the skew adjusting circuitry 130 is configured to analyze time difference information (e.g., time difference value Δt described later) within even-numbered sampling periods TS of the clock signals $CLK_0$-$CLK_{M-1}$ according to multiple quantized outputs $CQ_0$-$CQ_{M-1}$, so as to generate multiple adjustment signals $T_0$-$T_{M-1}$. In some embodiments, the skew adjusting circuitry 130 outputs multiple adjustment signals $T_0$-$T_{M-1}$ respectively to multiple ADC circuitries 110. In some embodiments, multiple adjustment signals $T_0$-$T_{M-1}$ are configured to indicate the timing adjustment required for multiple ADC circuitries 110 due to clock skew.

Specifically, the skew adjusting circuitry 130 comprises an adjusting circuit 132 and an adjusting circuit 134. The adjusting circuit 132 generates a first portion (i.e., $T_0, T_2, \ldots, T_{M-2}$) of the multiple adjustment signals $T_0$-$T_{M-1}$, and the adjusting circuit 134 generates a second portion (i.e., $T_1, T_3, \ldots, T_{M-1}$) of the multiple adjustment signals $T_0$-$T_{M-1}$.

Adjusting circuit 132 receives multiple quantized outputs $CQ_0, CQ_2, \ldots, CQ_{M-2}$ that correspond to the even-numbered ADC circuitries 110. Adjusting circuit 132 analyzes clock skew (equivalent to time difference information) existing between the even-numbered ADC circuitries 110 according to the even-numbered quantized outputs $CQ_0, CQ_2, \ldots, CQ_{M-2}$, so as to generate multiple adjustment signals $T_0, T_2, \ldots, T_{M-2}$. Since the quantized output $CQ_0$ corresponds to the first sampling time S1 and the quantized output $CQ_2$ corresponds to the third sampling time S3, the time difference between these two corresponding times is two sampling periods TS, so analyzing the quantized output $CQ_0$ and the quantized output $CQ_2$ can obtain the time difference information of the clock signal $CLK_0$ and the clock signal $CLK_2$ within two sampling period TS. Following the same principle, through this arrangement, the adjusting circuit 132 can analyze the time difference information of the clock signals $CLK_0, CLK_2, \ldots, CLK_{M-2}$ within two sampling periods TS.

Correspondingly, the adjusting circuit 134 receives odd-numbered quantized outputs $CQ_1, CQ_3, \ldots, CQ_{M-1}$ corresponding to odd-numbered ADC circuitries 110. Adjusting circuit 134 analyzes clock skew existing between the odd-numbered ADC circuitries 110 according to the odd-numbered quantized outputs $CQ_1, CQ_3, \ldots, CQ_{M-1}$, so as to generate multiple adjustment signals $T_1, T_3, \ldots, T_{M-1}$. Through this arrangement, the adjusting circuit 134 can analyze the time difference information of the clock signals $CLK_1, CLK_3, \ldots, CLK_{M-1}$ within two sampling periods TS.

Figure 2A:
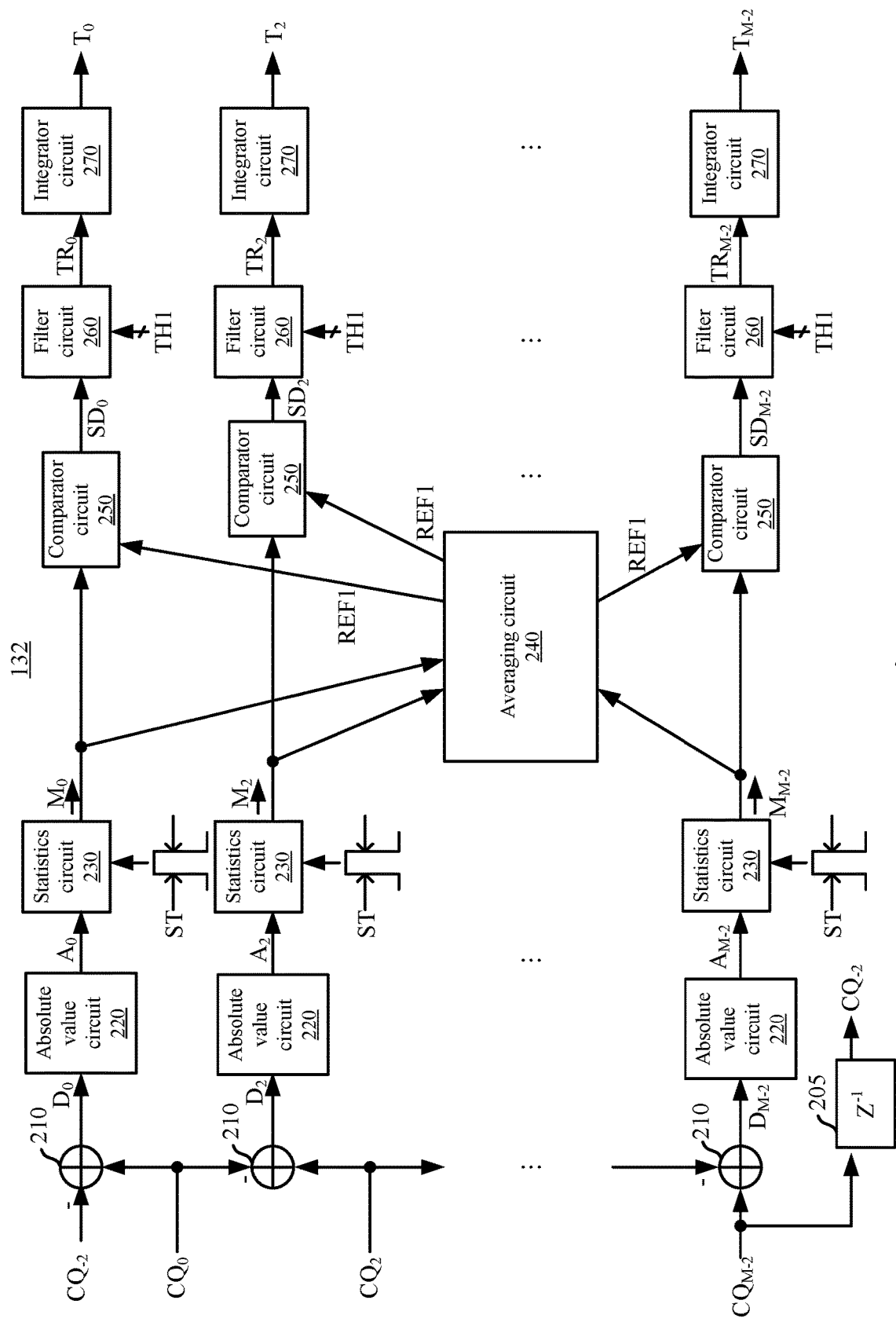
FIG. 2A is a circuit schematic of the adjusting circuit in FIG. 1A illustrated in accordance with some embodiments of the present application.

In some embodiments, the adjusting circuit 132 is configured to perform a statistics calculation to determine multiple calculation signals (e.g. $M_0, M_2, \ldots, M_{M-2}$ in FIG. 2A) that respectively correspond to the even-numbered quantized outputs $CQ_0, CQ_2, \ldots, CQ_{M-2}$, and average said calculation signals to generate a reference signal (e.g., REF1 in FIG. 2A). The adjusting circuit 132 further compares the reference signal with multiple calculation signals, so as to generate the multiple adjustment signals $T_0, T_2, \ldots, T_{M-2}$ described above. The operation here will be described in detail in the following paragraphs with reference to FIG. 2A.

Figure 2B:
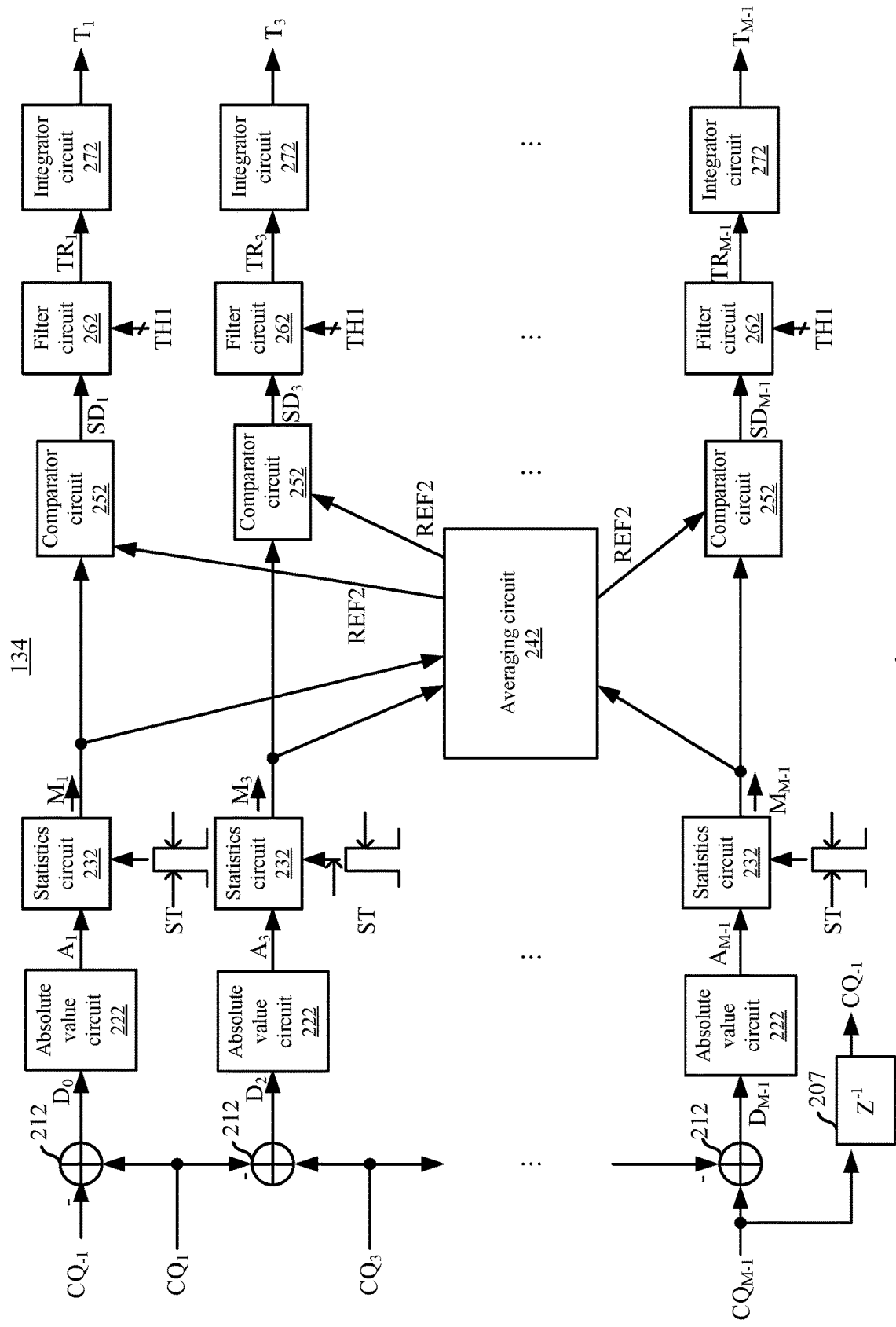
FIG. 2B is a circuit schematic of the adjusting circuit in FIG. 1A illustrated in accordance with some embodiments of the present application.

Correspondingly, in some embodiments, the adjusting circuit 134 is configured to perform a statistics calculation to determine multiple calculation signals (e.g. $M_1, M_3, \ldots, M_{M-1}$ in FIG. 2B) that respectively correspond to the odd-numbered quantized outputs $CQ_1, CQ_3, \ldots, CQ_{M-1}$, and average said calculation signals to generate a reference signal (e.g., REF2 in FIG. 2B). The adjusting circuit 134 further compares the reference signal with multiple calculation signals, so as to generate the multiple adjustment signals $T_1, T_3, \ldots, T_{M-1}$ described above.

In some embodiments, multiple ADC circuitries 110 can adjust the execution timing of sampling operations and/or analog-to-digital conversion operations according to multiple adjustment signals $T_0$-$T_{M-1}$, so as to achieve effect of a clock skew calibration. Alternatively, in some embodiments, the timing of the multiple clock signals $CLK_0$-$CLK_{M-1}$ can be directly adjusted according to multiple adjustment signals $T_0$-$T_{M-1}$, so as to achieve effect of reducing the clock skew. For example, multiple adjustment signals $T_0$-$T_{M-1}$ are input to a clock generator, a phase interpolator or a digital delay control line for generating multiple clock signals $CLK_0$-$CLK_{M-1}$, so as to adjust the phase of the multiple clock signals $CLK_0$-$CLK_{M-1}$. The above arrangement of reducing clock skew according to adjustment signals $T_0$-$T_{M-1}$ is used as illustrative examples, and this application is not limited thereto.

The output circuitry 140 is coupled to the calibration circuitry 120 to receive calibrated multiple quantized outputs $CQ_0$-$CQ_{M-1}$. The output circuitry 140 performs a data combination operation according to the calibrated multiple quantized outputs $CQ_0$-$CQ_{M-1}$ to generate a digital signal SOUT. Via the data combination operation, the multiple quantized outputs $CQ_0$-$CQ_{M-1}$ provided by the M channels can be combined into a single digital signal SOUT having M times the sampling frequency fs. In some embodiments, the output circuitry 140 can be implemented via a multiplexer circuit, but the present application is not limited thereto.

Referring to FIG. 2A, FIG. 2A is a circuit schematic of the adjusting circuit 132 in FIG. 1A illustrated in accordance with some embodiments of the present application. To facilitate understanding, similar components in FIG. 2A are designated with the same reference numerals with reference to FIG. 1A.

In some embodiments, the adjusting circuit 132 includes a delay circuit 205, multiple arithmetic circuits 210, absolute value circuits 220, statistics circuits 230, an averaging circuit 240, and comparator circuits 250.

The delay circuit 205 is configured to delay the last even-numbered quantized output $CQ_{M-2}$ in FIG. 1A, so as to generate a delayed quantized output $CQ_{-2}$. In some embodiments, the delay time introduced by the delay circuit 205 corresponds to M sampling periods TS in FIG. 1B. The delay circuit 205 can be implemented by various digital circuits, such as buffers, inverters, filters, and the like. The implementation of the delay circuit 205 described above is used as an illustrative example, and the present application is not limited thereto.

A plurality of arithmetic circuits 210 are coupled to the calibration circuitry 120 in FIG. 1A. A plurality of arithmetic circuits 210 sequentially receives two of the even-numbered quantized outputs $C_{Q-2}$, $CQ_0$, . . . , $CQ_{M-2}$, so as to generate multiple difference signals $D_0$, $D_2$, . . . , $D_{M-2}$. Using the first arithmetic circuit 210 as an example, the first arithmetic circuit 210 receives quantized outputs $CQ_{-2}$ and $CQ_0$, and calculates a difference between the quantized output $CQ_0$ and the quantized output $CQ_{-2}$, so as to generate a difference signal $D_0$. The arrangement and operation of the remaining arithmetic circuits 210 can follow the same principle, and is thus not repeated herein.

In some embodiments, the arithmetic circuit 210 can be implemented via a subtractor circuit or other processing circuits with the same function. The various circuits implementing the arithmetic circuits 210 are all covered within the scope of this application.

Multiple absolute value circuits 220 are coupled to the multiple arithmetic circuits 210 to receive the multiple difference signals $D_0$, $D_2$, . . . , $D_{M-2}$, respectively. Each absolute value circuit 220 performs an absolute value operation according to a corresponding one of the multiple difference signals $D_0$, $D_2$, . . . , $D_{M-2}$, so as to generate a corresponding one of the multiple absolute value signals $A_0$, $A_2$, . . . , $A_{M-2}$. Using the first absolute value circuit 220 as an example, the first absolute value circuit 220 receives the difference signal $D_0$, and performs an absolute value operation to obtain an absolute value of the difference signal $D_0$, so as to generate an absolute value signal $A_0$. The arrangement and operation of the remaining absolute value circuits 220 can follow the same principle, and is thus not repeated herein.

In some embodiments, the absolute value circuit 220 can be implemented by a processing circuit or a rectifier circuit. The various circuits implementing the absolute value circuits 220 are all covered within the scope of this application.

Multiple statistics circuits 230 are coupled to the multiple absolute value circuits 220 to receive multiple absolute value signals $A_0$, $A_2$, . . . , $A_{M-2}$, respectively. Each statistics circuit 230 is configured to continuously receive a corresponding absolute value signal of the multiple absolute value signals $A_0$, $A_2$, . . . , $A_{M-2}$ in a predetermined time frame ST, and perform statistics calculations to output a corresponding one of the multiple calculation signals $M_0$, $M_2$, . . . , $M_{M-2}$.

In some embodiments, the aforementioned statistics operation can be a maximum value operation or an averaging operation. Using the first statistics circuit 230 as an example, the first statistics circuit 230 continuously receives an absolute value signal $A_0$ in a predetermined time frame ST, and performs a maximum value operation to output the largest absolute value signal $A_0$ as the calculate signal $M_0$. Alternatively, the first statistics circuit 230 continuously receives an absolute value signal $A_0$ in a predetermined time frame ST, and performs an averaging operation so as to average all of the absolute value signals $A_0$ to generate the calculated signal $M_0$. The arrangement and operation of the remaining statistics circuits 230 can follow the same principle, and is thus not repeated herein.

In some embodiments, the statistics circuit 230 can be implemented via a digital processing circuit, a comparator circuit and/or a register circuit, but the present application is not limited thereto. The various circuits implementing the statistics circuits 230 are all covered within the scope of this application.

The averaging circuit 240 is coupled to multiple statistic circuits 230 to receive multiple calculation signals $M_0$, $M_2$, . . . , $M_{M-2}$. The averaging circuit 240 is configured to perform an averaging operation according to the multiple calculation signals $M_0$, $M_2$, . . . , $M_{M-2}$ to average the multiple calculation signals $M_0$, $M_2$, . . . , $M_{M-2}$, so as to generate a reference signal REF1. In some embodiments, the averaging circuit 240 can be implemented via a digital processing circuit, but the present application is not limited thereto.

Multiple comparator circuits 250 are coupled to the averaging circuit 240 to receive the reference signal REF1. Each of the multiple comparator circuits 250 compares a corresponding one of the multiple calculation signals $M_0$, $M_2$, . . . , $M_{M-2}$ with the reference signal REF1 to generate a corresponding one of multiple detection signals $SD_0$, $SD_2$, . . . , $SD_{M-2}$. Using the first comparator circuit 250 as an example, the comparator circuit 250 compares the calculation signal $M_0$ with the reference signal REF1, so as to generate the detection signal $SD_0$. The arrangement and operation of the remaining comparator circuits 250 can follow the same principle, and is thus not repeated herein.

In some embodiments, the comparator circuit 250 can be implemented via a comparator. Alternatively, in some embodiments, the comparator circuit 250 can be implemented via a subtractor circuit, and subtracts a corresponding one of the calculation signals $M_0, M_2, \ldots, M_{M-2}$ from the reference signal REF1, so as to generate a corresponding one of the multiple detection signals $SD_0, SD_2, \ldots, SD_{M-2}$. The above embodiments regarding the comparator circuit 250 are used as illustrative examples, and the present application is not limited thereto.

In some embodiments, multiple detection signals $SD_0, SD_2, \ldots, SD_{M-2}$ can be directly output as the multiple adjustment signals $T_0, T_2, \ldots, T_{M-2}$ of FIG. 1A. In some embodiments, multiple difference signals $D_0, D_2, \ldots, D_{M-2}$ (or multiple detection signals $SD_0, SD_2, \ldots, SD_{M-2}$) are associated with the time information of the clock skew in even-numbered channels, which can reflect the clock skew generated on the corresponding even-numbered ADC circuitries 110. Using the operation of the first arithmetic circuit 210 as an example, as shown in FIG. 2A, since the adjustment signal $T_0$ is generated based on the difference between quantized output $CQ_{-2}$ and quantized output $CQ_0$, the adjustment signal $T_0$ can be used to indicate the time difference between the sampling time S1 corresponding to the quantized output $CQ_0$ and the sampling time S3 corresponding to the quantized output $CQ_{-2}$. The difference signal $D_0$ in the time domain can be derived as the following equation (1):

$$CQ_0 - CQ_{-2} = \sin(2\pi f(k+2)T) - \sin(2\pi fk(T+\Delta t)) \quad (1)$$
$$= 2\cos(2\pi fkT + 2\pi fT + \pi fk\Delta T) \cdot \sin(2\pi fT - \pi fk\Delta t)$$

Wherein, (k+2)T is used to indicate a sampling time point corresponding to the quantized output $CQ_0$, k is used to indicate a sampling time point corresponding to the quantized output $CQ_{-2}$, f is the frequency of the input signal SIN, T is the aforementioned sampling period TS, and $\Delta t$ is the time difference.

If the frequency f is far smaller than ½T, then the equation (1) can be further derived as the following equation (2):

$$\sin(2\pi f(k+2)T) - \sin(2\pi fk(T+\Delta f)) = 2 \cos(2\pi fkT + 2\pi fT + \pi kf\Delta t) \cdot (2\pi fT - \pi fk\Delta t) \quad (2)$$

It can be known from the equation (2) that when the condition of frequency f being far smaller than ½T is met, the time difference $\Delta t$ is related to the amplitude of the difference signal $D_0$ (i.e., $2\pi fT - \pi fk\Delta t$). Therefore, through the operation of the absolute value circuit 220 and the statistics circuit 230, the calculation signal $M_0$ can reflect the information of the time difference $\Delta t$.

Accordingly, by comparing the calculation signal $M_0$ with the reference signal REF1, the influence of the time difference $\Delta t$ caused by the clock skew can be known. For example, if the calculation signal $M_0$ is greater than the reference signal REF1, it means that the effect of the time difference $\Delta t$ is positive. Under this condition, the clock skew causes the phase of the clock signal $CLK_0$ to incorrectly lead. Alternatively, if the calculation signal $M_0$ is smaller than the reference signal REF1, it means that the effect of the time difference $\Delta t$ is negative. Under this condition, the clock skew causes the phase of the clock signal $CLK_0$ to incorrectly lag. Thus, depending on the comparison result, the detection signal $SD_0$ will have different logic values to reflect the phase information of the first ADC circuitry 110 that requires adjustment due to the clock skew. Following the same principles, each of the above operations can be applied to each of the adjustment signals $T_2, \ldots, T_{M-2}$ and the detection signals $SD_2, \ldots, SD_{M-2}$, and thus not being repeated herein.

In some further embodiments, the adjusting circuit 132 can further include multiple filter circuits 260 and multiple integrator circuits 270. Multiple filter circuits 260 are coupled to multiple comparator circuits 250 to receive multiple detection signals $SD_0, SD_2, \ldots, SD_{M-2}$, respectively.

Multiple filter circuits 260 generate multiple trigger signals $TR_0, TR_2, \ldots, TR_{M-2}$ according to multiple detection signals $SD_0, SD_2, \ldots, SD_{M-2}$ and at least one threshold TH1. Multiple integrator circuits 270 are coupled to multiple filter circuits 260 to receive multiple trigger signals $TR_0, TR_2, \ldots, TR_{M-2}$, respectively. Multiple integrator circuits 270 generate multiple adjustment signals $T_0, T_2, \ldots, T_{M-2}$ according to multiple trigger signals $TR_0, TR_2, \ldots, TR_{M-2}$.

Using the first filter circuit 260 and the first integrator circuit 270 as an example, the filter circuit 260 is coupled to the first comparator circuit 250 to receive the detection signal $SD_0$. In some embodiments, the filter circuit 260 can continuously accumulate the detection signal $SD_0$, and compare the accumulated detection signal SD0 with the at least one threshold TH1, so as to output one or more trigger signals $TR_0$. For example, when the accumulated detection signal $SD_0$ is greater than the at least one threshold TH1, the filter circuit 260 outputs the accumulated detection signal $SD_0$ as a corresponding trigger signal $TR_0$. The first integrator circuit 270 is coupled to the first filter circuit 260 for receiving the trigger signal $TR_0$. The integrator circuit 270 is configured to accumulate the trigger signal $TR_0$, and to output the accumulated trigger signal $TR_0$ as the adjustment signal $T_0$, so as to cater to different timing control methods. The arrangement and operation of the remaining filter circuits 260 and integrator circuits 270 can follow the same principle, and is thus not repeated herein.

The number of executions for calibrating clock skew can be reduced by implementing the filter circuit 260, so as to reduce the dynamic power consumption of the ADC device 100. Meanwhile, implementing the filter circuit 260 can also reduce the jitter caused by the clock skew calibration. By implementing the integrator circuit 270, the timing adjustment method can be configured to a method of corresponding value adjustment. In practical applications, the filter circuit 260 and the integrator circuit 270 can be selectively implemented according to actual needs. In addition, the aforementioned threshold TH1 can also be adjusted according to actual needs.

In various embodiments, the filter circuit 260 and the integrator circuit 270 can be implemented via at least one comparator (for example, can be used for comparing the trigger signal with the threshold TH1, or compare the accumulated trigger signals), at least one register (for example, can be used for storing the aforementioned accumulated signals or the accumulated trigger signals, etc.), at least a clear circuit (for example, can be used for clearing data of the aforementioned register) and/or at least one arithmetic circuit (for example, can be used for generating an accumulative signal or used to accumulate trigger signals). The above arrangement regarding the filter circuit 260 and the integrator circuit 270 are used as illustrative examples, and this application is not limited thereto.

Referring to FIG. 2B, FIG. 2B is a circuit schematic of the adjusting circuit 134 of FIG. 1A illustrated according to some embodiments of the present application. To facilitate understanding, similar components in FIG. 2B are designated with the same reference numerals with reference to FIG. 1A.

In some embodiments, the circuit structure of the adjusting circuit 134 is the same as that of the adjusting circuit 132. For example, the adjusting circuit 134 includes a delay circuit 207, multiple arithmetic circuits 212, absolute value circuits 222, statistics circuits 232, an averaging circuit 242, and comparator circuits 252.

The delay circuit 207 delays the quantized output $CQ_{M-1}$ in FIG. 1A to generate a delayed quantized output $CQ_{-1}$. Multiple arithmetic circuits 212 sequentially receive two of the even-numbered quantized outputs $CQ_{-1}$, $CQ_1$, ..., $CQ_{M-1}$ to respectively generate multiple difference signals $D_1$, $D_3$, ..., $D_{M-1}$. Multiple absolute value circuits 222 receive multiple difference signals $D_1$, $D_3$, ..., $D_{M-1}$ and generate multiple absolute value signals $A_1$, $A_3$, ..., $A_{M-1}$, respectively. Multiple statistics circuits 232 receive multiple absolute value signals $A_1$, $A_3$, ..., $A_{M-1}$ and output multiple calculation signals $M_1$, $M_3$, ..., $M_{M-1}$ respectively. The averaging circuit 242 averages the multiple calculation signals $M_1$, $M_3$, ..., $M_{M-1}$ to output a reference signal REF2. Multiple comparator circuits 252 each compare a corresponding one of the multiple calculation signals $M_1$, $M_3$, ..., $M_{M-1}$ with the reference signal REF2, so as to generate a corresponding one of multiple detection signals $SD_1$, $SD_3$, ..., $SD_{M-1}$. The detailed settings and operations of the adjusting circuit 134 are similar to the adjusting circuit 132 as described above, and are not repeated herein.

In some further embodiments, the adjusting circuit 134 can further include multiple filter circuits 262 and multiple integrator circuits 272 to generate multiple adjustment signals $T_1$, $T_3$, ..., $T_{M-1}$ according to multiple trigger signals $TR_1$, $TR_3$, ..., $TR_{M-1}$. The operations of the filter circuit 262 and the integrator circuit 272 are similar to the filter circuit 260 and the integrator circuit 270 as described above, and are not repeated herein.

Figure 3:
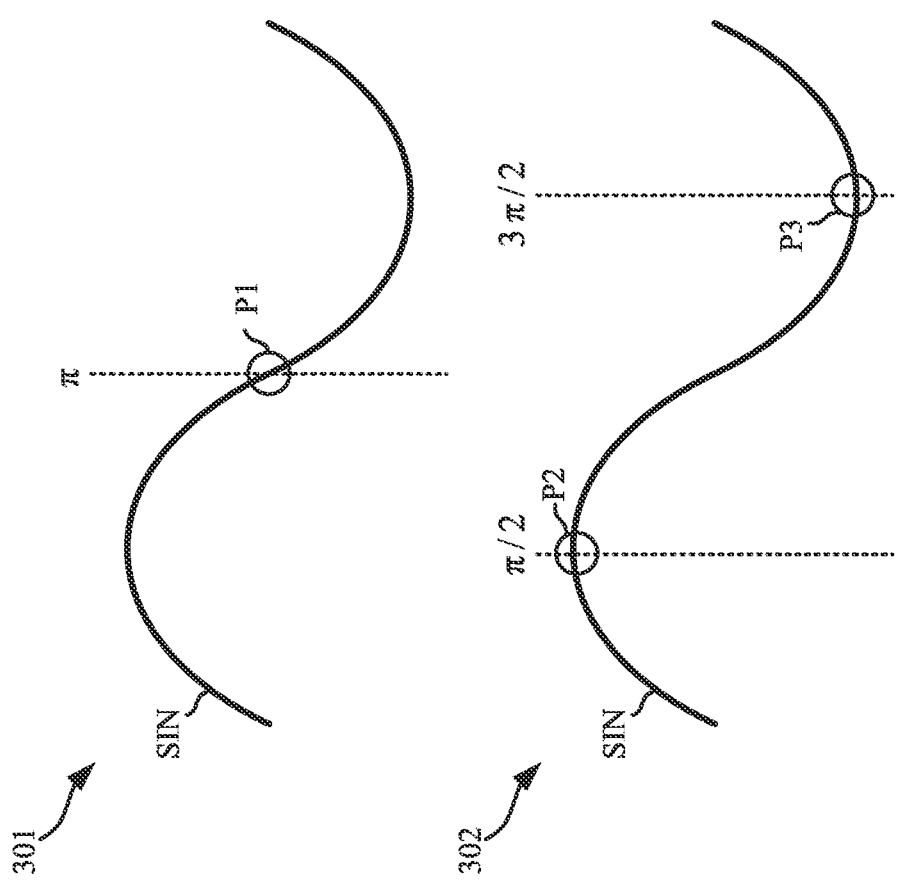
FIG. 3 is a waveform diagram of an input signal illustrated in accordance with some embodiments of the present application.

Referring to FIG. 3, FIG. 3 is a waveform diagram of the input signal SIN illustrated according to some embodiments of the present application.

In some situations, when the frequency f of the input signal SIN is close to ½ of the sampling frequency fs, that is when f≈½TS, the following equation (3) can be derived from the above equation (1):

$$CQ_0 - CQ_{-2} = 2\cos(2\pi fkT + 2\pi fT + \pi f\Delta T)\cdot\sin(\pi - \pi fk\Delta t) \quad (3)$$

It can be known from equation (3) that the information on time difference Δt is related the factor sin (π). As shown by the waveform 301, when the input signal SIN corresponds to the phase angle π, the corresponding sampling point P1 is located at the position where the slope of the input signal SIN is the largest. Therefore, the information on the time difference Δt analyzed via the sampling point P1 can have a more significant change. As such, under the condition that the frequency f of the input signal SIN is close to ½ of the sampling frequency fs, the ADC device 100 can effectively calibrate the clock skew by analyzing the time difference information of the clock signal $CLK_0$-$CLK_{M-1}$ within even-numbered sampling periods TS (as in this example, being 2 sampling periods).

In some related techniques, the skew adjusting circuit analyzes time difference information of multiple clock signals within each of the sampling periods. In these techniques, (k+2)T in the above equation (1) needs to be modified to (k+1)T, and the factor sin(π−πfkΔt) of the equation (3) needs to be modified to sin(π/2−πfkΔt). Accordingly, the information of the time difference Δt is related to the factor sin (π/2). As shown by the waveform 302, when the input signal SIN corresponds to the phase angle π/2, the corresponding sampling point P2 or P3 is located at the position of a valley or a peak, and its change is relatively small. Therefore, the information of the time difference Δt analyzed via the sampling point P2 or P3 is insufficient, and the clock skew cannot be effectively calibrated under the condition where the frequency f of the input signal SIN is close to ½ of the sampling frequency fs.

Figure 4:
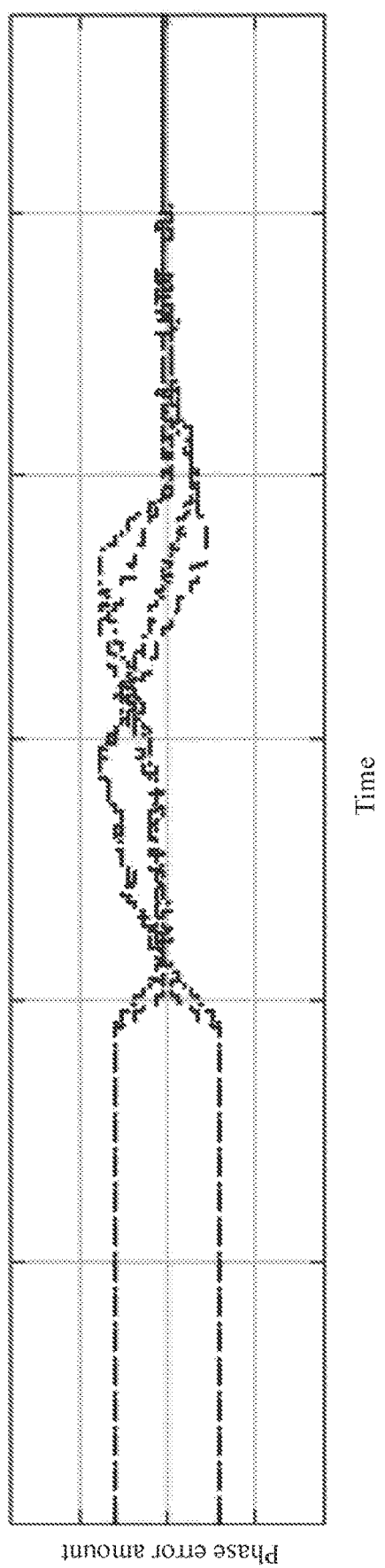
FIG. 4 is a simulation result schematic of a clock skew calibration illustrated in accordance with some embodiments of the present application.

Referring to FIG. 4, FIG. 4 is a simulation result schematic of a clock skew calibration illustrated in accordance with some embodiments of the present application.

As shown in FIG. 4, in one embodiment, the ADC device 100 in FIG. 1A is provided with four channels (i.e., having four ADC circuitries 110), the frequency f of the input signal SIN is set to 12.9 GHz, and the sampling frequency fs is set to 28 GHz. When the frequency f of the input signal SIN is close to ½ of the sampling frequency fs, it can be seen through the calibration operation of the aforementioned embodiment, that the phase error between the four channels are able to gradually and accurately converge to 0.

Figure 5:
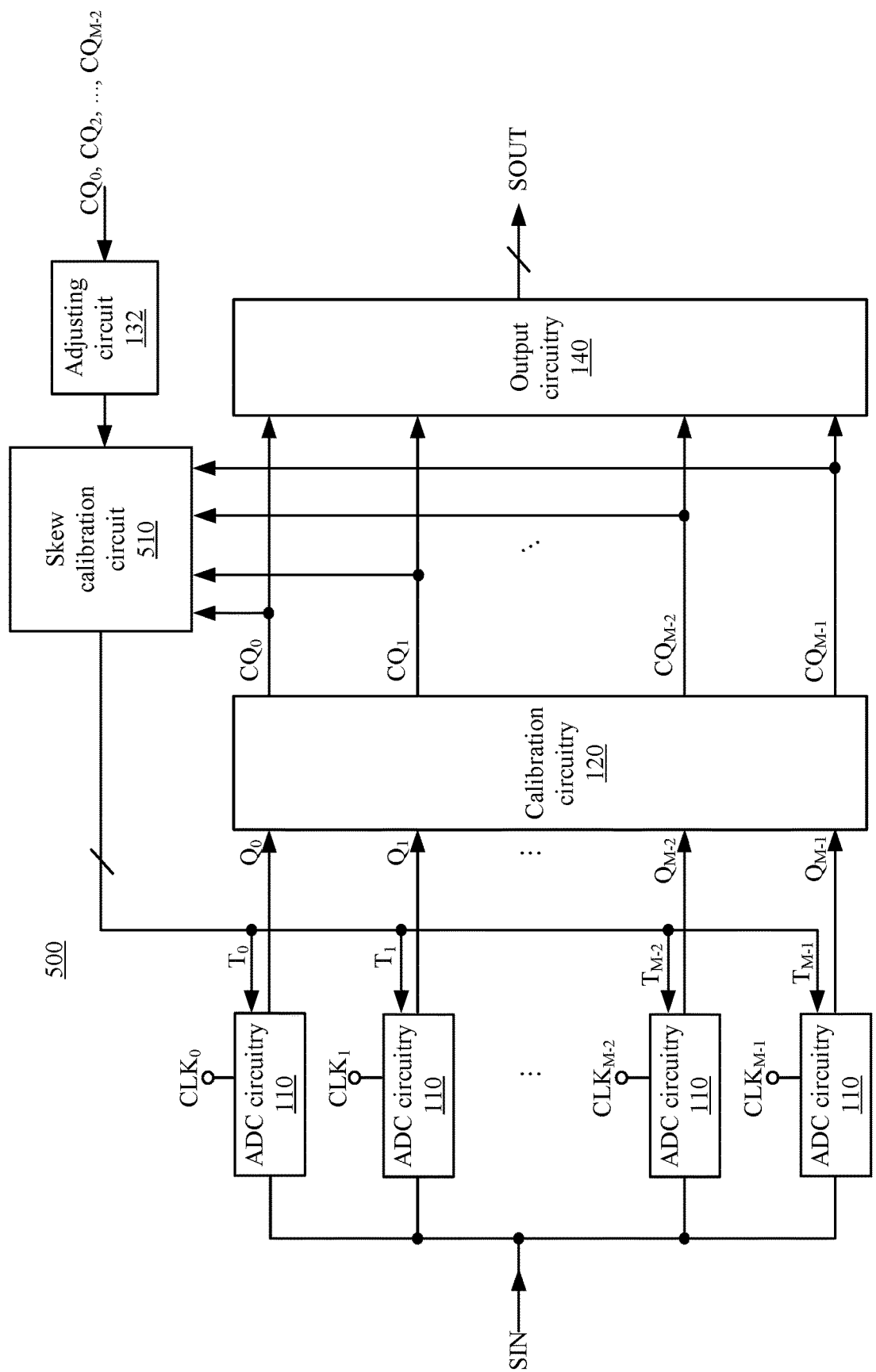
FIG. 5 is a schematic of an analog-to-digital converter device illustrated in accordance with some embodiments of the present application.

Referring FIG. 5, FIG. 5 is a schematic of an ADC device 100 illustrated in accordance with some embodiments of the present application. To facilitate understanding, similar components in FIG. 5 and FIG. 1A are designated by the same reference numerals.

In this example, the ADC device 500 further includes a skew calibration circuit 510. The skew calibration circuit 510 can analyze the time difference information of multiple clock signals $CLK_0$-$CLK_{M-1}$ within each sampling period TS according to the multiple quantized outputs $CQ_0$-$CQ_{M-1}$ and the time difference Δt obtained by the adjusting circuit 132, so as to generate multiple adjustment signals $T_0$-$T_{M-1}$ for calibrating clock skew. As previously described, the information on the time difference Δt generated by the adjusting circuit 132 can have a more significant change. Therefore, the calibration process of the clock skew can be made more efficient by the additional assistance from the time difference Δt.

In some embodiments, the skew calibration circuit 510 and the adjusting circuit 132 can share a portion of the circuit, such as the filter circuit 260 and the integrator circuit 270 described above. In some embodiments, the skew calibration circuit 510 can also cooperate with the adjusting circuit 134. In some embodiments, the skew calibration circuit 510 can also cooperate with the adjusting circuit 132 and the adjusting circuit 134 at the same time.

Each of the above embodiments uses the operation of the skew adjusting circuit 130 analyzing time difference information within two sampling periods TS as examples, but the present application is not limited thereto. Depending on various applications, the above embodiments can also be modified to analyze time difference information within any even-number of sampling periods TS. For example, if it is desired to obtain time difference information within four periods TS, the quantized output $CQ_0$ and the quantized output $CQ_4$ can be analyzed, or the quantized output $CQ_1$ and the quantized output $CQ_5$ can be analyzed.

Figure 6:
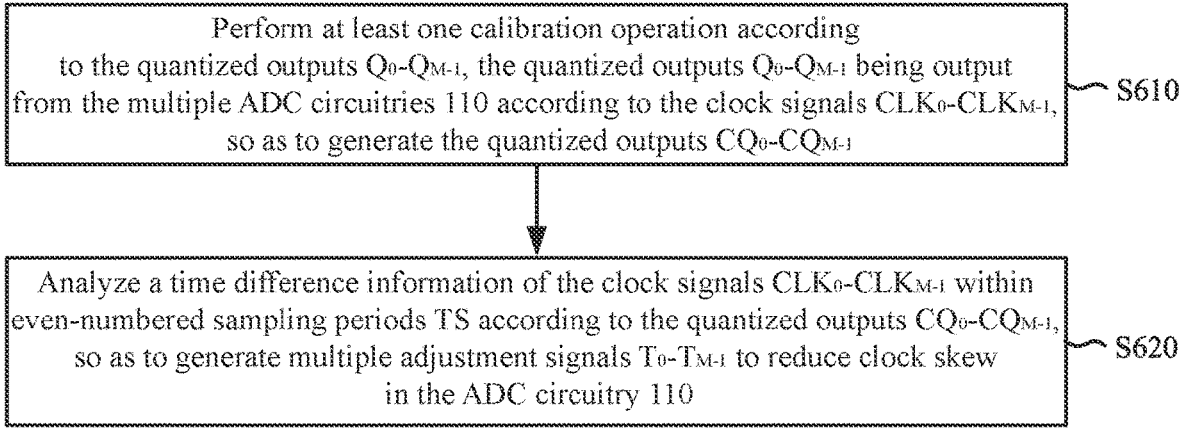
FIG. 6 is a flowchart of a clock skew calibration method illustrated in accordance with some embodiments of the present application.

Referring FIG. 6, FIG. 6 is a flowchart of a clock skew calibration method 600 illustrated in accordance with some embodiments of the present application. To facilitate understanding, the calibration method 600 is described with reference to the various figures mentioned above.

At operation S610, at least one calibration operation is performed according to the quantized outputs $Q_0$-$Q_{M-1}$, the quantized outputs $Q_0$-$Q_{M-1}$ being output from the multiple ADC circuitries 110 according to the clock signals $CLK_0$-$CLK_{M-1}$, so as to generate the quantized outputs $CQ_0$-$CQ_{M-1}$.

In operation S620, a time difference information of the clock signals $CLK_0$-$CLK_{M-1}$ within even-numbered sampling periods TS is analyzed according to the quantized outputs $CQ_0$-$CQ_{M-1}$, so as to generate multiple adjustment signals $T_0$-$T_{M-1}$ to reduce a clock skew in the ADC circuitry 110.

The description of the various aforementioned operations and their implementations can be referred to in the descriptions of the various aforementioned embodiments, and is thus not repeated herein.

The multiple operations of the aforementioned clock skew calibration method 600 are merely illustrative, and are not necessarily limited to being executed in the order shown in the example. Without departing from the operation and scope of the various embodiments, the various operations under the clock skew calibration method 600 can be appropriately added, replaced, omitted or executed in a different order.

In summary, the ADC device and the clock skew calibration method provided in some embodiments of the present application can perform calibration by utilizing time difference information of multiple clock signals within even-numbered sampling periods. As such, when the frequency of the input signal is close to the sampling frequency, the clock skew can still be effectively calibrated.

Although the present application has been disclosed with the above embodiments, said embodiments do not limit the present application; any person skilled in the art can make various modifications and refinements without departing from the spirit and scope of the present application; therefore, the protected scope of this application should be determined based on those defined by the claims that follow.

What is claimed is:

1. An analog-to-digital converter device, comprising:
a plurality of analog-to-digital converter circuitries configured to convert an input signal according to an interleaved plurality of clock signals to generate a plurality of first quantized outputs;
a calibration circuitry configured to perform at least one calibration operation according to the first quantized outputs to generate a plurality of second quantized outputs; and
a skew adjusting circuitry configured to analyze a time difference information within even-numbered sampling periods of the clock signals according to the second quantized outputs, so as to generate a plurality of adjustment signals, wherein the adjustment signals are for reducing a clock skew in the analog-to-digital converter circuitries, and the skew adjusting circuitry comprises:
a first adjusting circuit configured to analyze even-numbered quantized outputs in the second quantized outputs, so as to generate a first portion of the adjustment signals; and
a second adjusting circuit configured to analyze odd-numbered quantized outputs in the second quantized outputs, so as to generate a second portion of the adjustment signals;
wherein the first adjusting circuit comprises:
a delay circuit, configured to delay the last one of the even-numbered quantized outputs, so as to generate a delayed quantized output;
a plurality of arithmetic circuits, configured to sequentially receive two signals in the delayed quantized output and the even-numbered quantized outputs, so as to respectively generate a plurality of difference signals, wherein the difference signals are associated with the time difference information;
a plurality of absolute value circuits, wherein each of the plurality of absolute value circuits are configured to perform an absolute value operation according to a corresponding difference signal among the difference signals, so as to generate a corresponding one of a plurality of absolute value signals;
a plurality of statistics circuits, wherein each of the plurality of statistics circuits is configured to receive a corresponding absolute value signal among the absolute value signals within a predetermined period of time, and perform a statistics operation to output a corresponding one of a plurality of calculation signals;
an averaging circuit, configured to average the calculation signals to generate a reference signal; and
a plurality of comparator circuits, which respectively compare the calculation signals with the reference signal to generate a plurality of detection signals.

2. The analog-to-digital converter device of claim 1, wherein the first adjusting circuit outputs the detection signals as the first portion of the adjustment signals.

3. The analog-to-digital converter device of claim 1, wherein the skew adjusting circuitry further comprises:
a plurality of filter circuits configured to generate a plurality of trigger signals according to the detection signals and at least one threshold; and
a plurality of integrator circuits, wherein each of the integrator circuits is configured to accumulate a corresponding trigger signal among the trigger signals, and to output the accumulated corresponding trigger signal as a corresponding adjustment signal in the first portion of the adjustment signals.

4. The analog-to-digital converter device of claim 3, wherein each of the filter circuits is configured to accumulate a corresponding detection signal among the detection signals, and output the accumulated corresponding detection signal as a corresponding one of the trigger signals when the accumulated corresponding detection signal is greater than the at least one threshold.

5. The analog-to-digital converter device of claim 1, wherein a circuit structure of the second adjusting circuit is the same as a circuit structure of the first adjusting circuit.

6. The analog-to-digital converter device of claim 1, wherein the analog-to-digital converter circuitries operate as a time interleaved analog-to-digital converter.

7. A clock skew calibration method, comprising:
performing at least one calibration operation according to a plurality of first quantized outputs, the plurality of first quantized outputs being output from a plurality of analog-to-digital converter circuitries according to a plurality of clock signals, so as to generate a plurality of second quantized outputs; and
analyzing a time difference information of the clock signals within even-numbered sampling periods according to the second quantized outputs, so as to generate a plurality of adjustment signals to reduce a clock skew in the analog-to-digital converter circuitries, wherein generating the adjustment signals comprises:

analyzing even-numbered quantized outputs in the second quantized outputs, so as to generate a first portion of the adjustment signals; and analyzing odd-numbered quantized outputs in the second quantized outputs, so as to generate a second portion of the adjustment signals;

wherein generating the first portion of the adjustment signals comprises:

delaying the last one of the second quantized outputs, so as to generate a delayed quantized output;

sequentially generating a plurality of difference signals according to two signals in the delayed quantized output and the even-numbered quantized outputs, wherein the difference signals are associated with the time difference information;

performing an absolute value operation according to a corresponding difference signal among the difference signals, so as to generate a corresponding one of a plurality of absolute value signals;

receiving a corresponding absolute value signal among the absolute value signals, and perform a statistics operation to output a corresponding one of a plurality of calculation signals;

averaging the calculation signals to generate a reference signal; and comparing the calculation signals with the reference signal to generate a plurality of detection signals.

8. The clock skew calibration method of claim 7, wherein the detection signals are output as the adjustment signals.

9. The clock skew calibration method of claim 7, further comprising:

generating a plurality of trigger signals according to the detection signals and at least one threshold; and accumulating a corresponding trigger signal among the trigger signals to output as a corresponding adjustment signal in the first portion of the adjustment signals.

10. The clock skew calibration method of claim 9, wherein generating the trigger signals comprises:

accumulating a corresponding detection signal among the detection signals, and output the accumulated corresponding detection signal as a corresponding one of the trigger signals when the accumulated corresponding detection signal is greater than the at least one threshold.

11. The clock skew calibration method of claim 7, wherein the analog-to-digital converter circuitries operate as a time interleaved analog-to-digital converter.

* * * * *